United States Patent [19]

Jacquart et al.

[11] 4,107,550
[45] Aug. 15, 1978

[54] BUCKET BRIGADE CIRCUITS

[75] Inventors: Christian A. Jacquart, Gattieres, France; Howard N. Leighton, Rockville, Md.; Raymond J. Wilfinger, Lagrangeville, N.Y.

[73] Assignee: International Business Machines Corporation, Armonk, N.Y.

[21] Appl. No.: 760,612

[22] Filed: Jan. 19, 1977

[51] Int. Cl.² .................. G08C 15/00; G11C 19/00; G06G 7/625; H03K 13/02
[52] U.S. Cl. .................. 307/241; 307/208; 307/221 D; 307/242; 307/243; 340/347 DA; 364/824; 364/862
[58] Field of Search .................. 307/208, 264, 221 C, 307/221 D, 224 C, 304, 241–244; 357/24; 333/70 T; 340/347 DA; 364/824, 825, 862

[56] References Cited

U.S. PATENT DOCUMENTS

| | | | |
|---|---|---|---|
| 3,763,480 | 10/1973 | Weimer | 307/221 C X |
| 3,809,923 | 5/1974 | Esser | 307/221 D |
| 3,877,056 | 4/1975 | Bailey | 357/24 |
| 3,885,167 | 5/1975 | Berglund | 357/24 X |
| 3,935,439 | 1/1976 | Buss et al. | 357/24 X |
| 3,947,705 | 3/1976 | Emmons | 307/221 D X |
| 3,955,101 | 5/1976 | Amelio et al. | 307/221 D X |
| 3,983,413 | 9/1976 | Gunsagar et al. | 307/221 D X |
| 3,997,973 | 12/1976 | Buss | 307/221 D X |
| 4,039,978 | 8/1977 | Heller | 307/221 D X |

OTHER PUBLICATIONS

Heller, "Bucket Brigade Charge Packet Diverter"; *IBM Tech. Discl. Bull.;* vol. 18, No. 8, pp. 2733–2734, Jan. 1976.

*Primary Examiner*—Larry N. Anagnos
*Attorney, Agent, or Firm*—John E. Hoel

[57] ABSTRACT

The underlying concept of the invention disclosed is the use of charge partitioning for providing a precision weighted tap in a bucket brigade circuit. At the drain node of a charge conducting element in a bucket brigade device, the signal path is split in half with a first half going to the source of a first FET and the second half going to the source of a second FET. The first and second FET devices have their associated overlap capacitances, transconductances and threshold voltages matched by virtue of their close proximity to one another on the semiconductor substrate so as to have matched charge transfer characteristics. The amplitude of the charge stored on the capacitor at the node is therefore divided into two parts, with one portion being transferred by the first FET device and the remaining portion being transferred by the second FET device. This simple circuit accomplishes a precise charge division for the charge entered into the bucket brigade circuit. Successive cells in the bucket brigade device can have their drain nodes connected to matched pairs of first and second FET devices to successively divide the charge stored therein by one-half so that a sequence of decrements in the charge transferred along the bucket brigade chain may be made in multiples of one-half. By selectively gating the outputs of each of the respective tapped branches from the bucket brigade device at a summing node, values of from zero to unity in fractional unit intervals can be generated as an analog output. A digital to analog converter may be formed by inputting a serialized digital word into the input of the bucket brigade device whose successive cells have attached thereto respective pairs of FET charge partitioning devices. The outputs of all branches are summed so that a resultant charge, which is the sum of the charges output by the charge partitioning transistors, will appear at the output as the analog value for the binary serial word input to the bucket brigade device.

5 Claims, 6 Drawing Figures

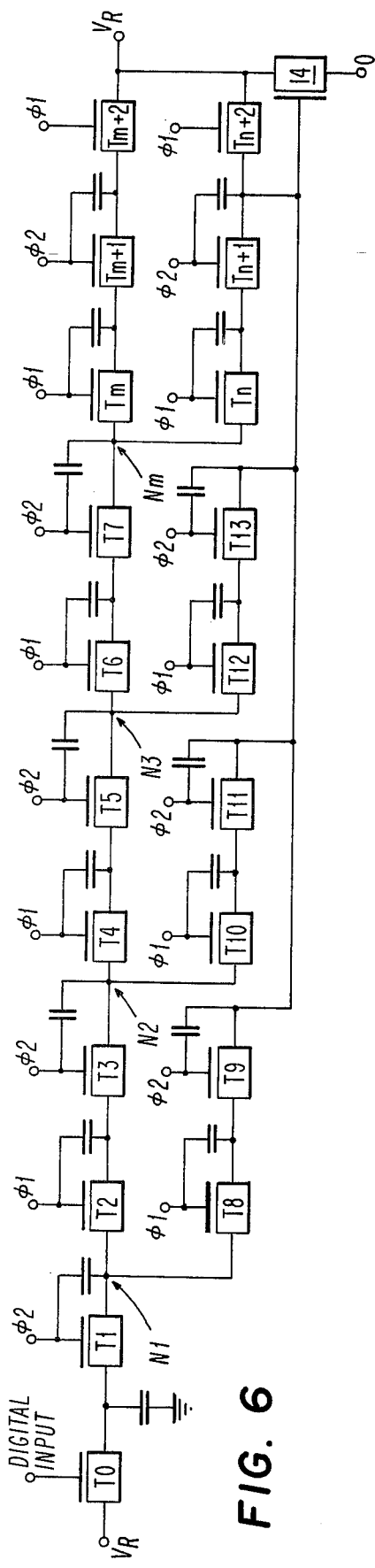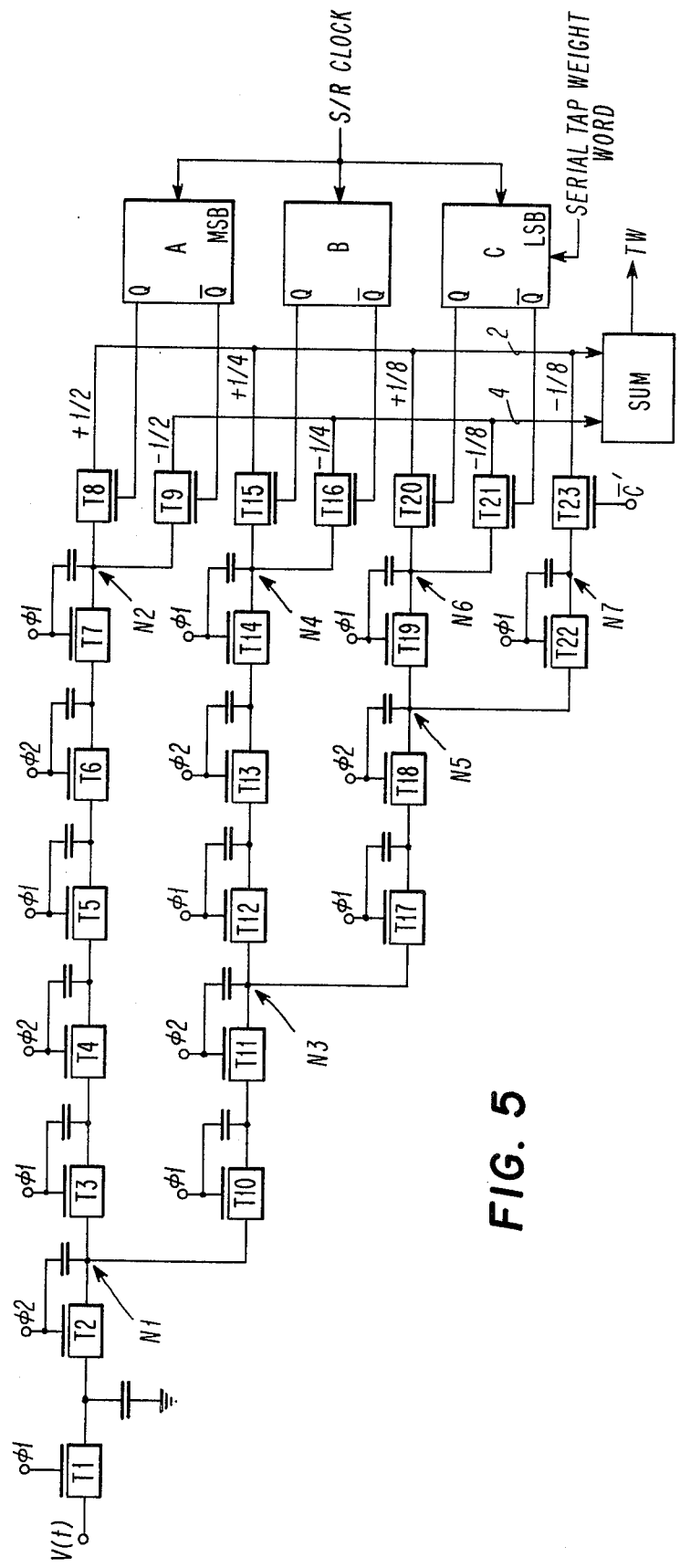
FIG. 6
FIG. 5

BUCKET BRIGADE CIRCUITS

FIELD OF THE INVENTION

The invention disclosed relates generally to semiconductor circuits and more particularly to bucket brigade charge transfer shift register circuits.

BACKGROUND OF THE INVENTION

Description of the Prior Art

Bucket brigade shift registers which operate based on the concept of transfer of charge deficit from stage to stage have been taught in an article by F. L. J. Sangster, entitled "The Bucket Brigade Delay Line: A Shift Register for Analogue Signals", which appeared on pages 92-110 of Volume 31, No. 4, 1970, of the Phillips Technical Review.

Broadly the bucket brigade concept taught by Sangster uses as each stage for the register a transistor and a capacitor and operates by causing the present charge on a first stage to be shifted from the capacitor in the first stage to the capacitor in the next adjacent stage.

Generally, a two phase shift register employs two, non-overlapping clock pulses 01 and 02. In such a shift register, only one-half of the storage capacitors of the array contain a signal sample at any given time.

FIG. 1 is a symbolic illustration of a transversal filter comprised of a sequence of delay blocks (D) fed by a signal input sampler block (S), with the nodes between the delay blocks (D) being respectively connected to tap weighting means $H_1$ through $H_M$, the output of which are summed as an output signal. In operation, the transversal filter receives an input signal $V(t)$ having a first waveform, which is sequentially delayed by the delay blocks D so that sampled delayed replicas of $V(t)$, $V_1$ through $V_M$, are respectively multiplied by tap weights $H_1$ through $H_M$, and the weighted products are summed to generate an output signal. The total transfer function may be programmed by programming the values of the tap weights.

FIG. 2 shows a conventional bucket brigade device, which operates as a connected sequence of delay stages. FIG. 3 describes a voltage divider technique employing precision resistors to form weighted taps at the nodes of successive FET device pairs in the bucket brigade circuit. In operation, the node between the drain of T1 and, the source of T2 in the circuit of FIG. 3, has a charge stored on the capacitor thereof, the magnitude of which is the analog signal to be weighted. The voltage corresponding to that charge is applied to the gate of transistor Q1 whose drain is connected to a positive power supply and whose source is connected to a precision resistor voltage divider, $R1a$-$R1b$. The magnitude of the charge at the node between T1 and T2 governs the conductivity of the transistor Q1 and thus the signal amplitude at the output 01 at the drain of transistor Q1. A significant problem which characterizes this approach to weighted taps is that the precision of the resistors R1 through RN cannot be held to close tolerances with diffused resistors in an integrated circuit structure. The poor performance of this prior voltage divider circuit precludes its use in integrated circuit implementations.

U.S. Pat. No. 3,809,923 to Esser discloses a transversal filter having adjustable weighting factors for a bucket brigade storage shift register. The goal of the patent is charge partitioning but the method for accomplishing it requires the availability of analog weighting signals, Column 4, line 43. Thus, the precision of the tap weighting in Esser is a function of the precision of the analog weighting signals, the tolerance of which is a function not only of the power supply tolerance, but also the tolerances of a variety of semiconductor device parameters.

OBJECTS OF THE INVENTION

It is therefore an object of the invention to provide precise value tap weights for a charge transfer device.

It is another object of the invention to provide an improved bucket brigade device with fixed tap weights.

It is still another object of the invention to provide an improved digital-to-analog converter.

It is yet another object of the invention to provide a more precise digital-to-analog conversion with a bucket brigade device.

It is a further object of the invention to provide an improved transversal filter.

SUMMARY OF THE INVENTION

These and other objects, features and advantages of the invention are provided by the bucket brigade circuits disclosed herein. The invention disclosed uses charge partitioning to provide a precision weighted tap in a bucket brigade circuit. At the drain node of a charge conducting element in a bucket brigade device, the signal path is split in half with a first half going to the source of a first FET and the second half going to the source of a second FET. The first and second FET devices have their associated overlap capacitances, transconductances and threshold voltages matched by virtue of their close proximity to one another on the semiconductor substrate so as to have matched charge transfer characteristics. The amplitude of the charge stored on the capacitor at the node is therefore divided into two parts, with one portion being transferred by the first FET device and the remaining portion being transferred by the second FET device. This simple circuit accomplishes a precise charge division for the charge entered into the bucket brigade circuit. Successive cells in the bucket brigade device can have their drain nodes connected to matched pairs of first and second FET devices to successively divide the charge stored therein by one-half so that a sequence of decrements in the charge transferred along the bucket brigade chain may be made in multiples of one-half. By selectively gating the outputs of each of the respective tapped branches from the bucket brigade device at a summing node, values of from zero to unity in fractional unit intervals can be generated as an analog output. A digital-to-analog converter may be formed by inputting a serialized digital word into the input of the bucket brigade device whose successive cells have attached thereto respective pairs of FET charge partitioning devices. The outputs of each of the branches output by the charge partitioning transistors, will appear at the output as the analog value for the binary serial word input to the bucket brigade device.

DESCRIPTION OF THE FIGURES

These and other objects, features and advantages of the invention can be more fully appreciated with reference to the accompanying drawings.

FIG. 5 shows a three-bit binary-weighted attenuator for application as a tap weight for a bucket brigade string employing the divert and divide principle according to the invention, to accomplish digitally controlled attenuation.

FIG. 6 shows an embodiment for a digital-to-analog converter employing the divert and divide principle according to the invention.

Figure 1:
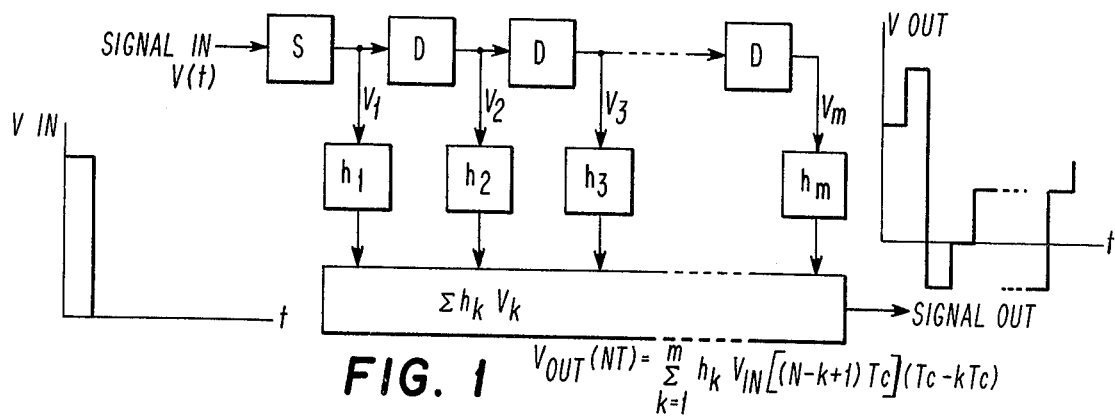
FIG. 1 is a symbolic illustration of a transversal filter.
Figure 2:
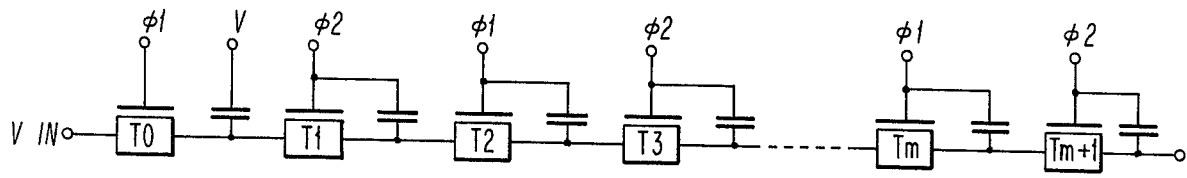
FIG. 2 shows a conventional bucket brigade device.
Figure 3:
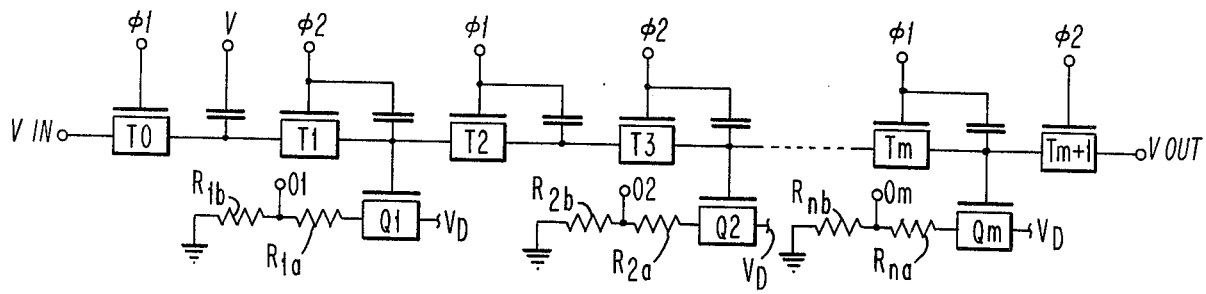
FIG. 3 shows a prior art bucket brigade circuit with weighted taps formed by resistors.
Figure 4:
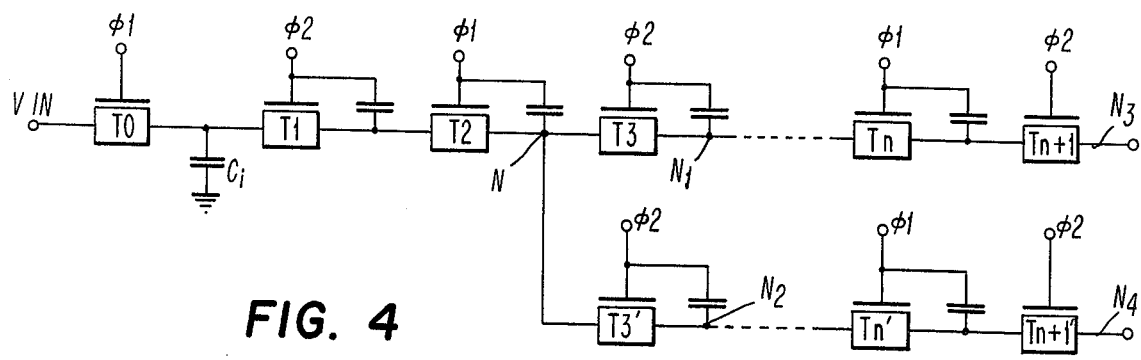
FIG. 4 shows the divert and divide modification to FIG. 2, according to the invention.

DISCUSSION OF THE PREFERRED EMBODIMENT:

FIG. 2 illustrates a conventional bucket brigade circuit and FIG. 4 shows the simplest form of the divert and divide circuit invention disclosed herein, for providing a one bit, precision weighted tap in a bucket brigade circuit. In the circuit of FIG. 4, FETs T0 through T2 remain the same as is shown in the conventional circuit of FIG. 2. At the drain node end of T2, the signal path is split in half with a first half going to the source of FET T3 and the second half going to the source of FET T3'. T3 and T3' with their associated enhanced overlap capacitances, are matched devices built in close proximity to one another on the semiconductor substrate so as to have matched overlap capacitances, transconductances and threshold voltages, and hence matched charge transfer characteristics. The amplitude of the charge stored on the capacitor at a node N is divided into two parts with one portion being transferred by the transistor T3 on the capacitor at the node N1, and the remaining portion being transferred by the transistor T3' to the capacitor at the node N2. Connected to node N1 is a first bucket brigade string which will propagate the charge at node N1 to the node N3. Connected to the node N2 is a bucket brigade string which will propagate the charge stored at the node N2 to the node N4. The simple circuit of FIG. 4 accomplishes a precise charge division for the charge entered into the bucket brigade circuit comprised of T0 through T2. The accuracy with which the charge divides equally is a function only of photolithographic tolerances and semiconductor process control variations. This charge division technique may be expanded as described below to achieve greater tap resolution.

FIG. 5 shows a three-bit binary-weighted attenuation for application as a tap weight for a bucket brigade string, using division by two. T1 clocked with the 01 pulse and T2 clocked with the 02 pulse constitute the input portion of the bucket brigade string with V(t) as the input signal waveform. At the node N1 at the drain of T2, the signal is divided between the bucket brigade string T3 through T7 and the bucket brigade string T10 through T11. Half of the analog signal at the node N1 will be propagated to the output N2 and the other half will be propagated to node N3 at the drain of T11. The charge stored at the node N3 is divided in half with one-half being propagated through the bucket brigade string T12 through T14 and the second half being propagated through T17 and T18 to node N3. Thus, the amplitude of the signal propagated to the output N4 is one-fourth of the input V(t). The charge stored at node N5 is divided in half with one-half being propagated through T19 yielding an output N6 of one-eighth of the input, the other half being propagated through T22 to node N7. By selectively switching the FET switches T8 and T9 at output N2, T15 and T16 at the output N4, and T20 and T21 at the output N6, tap weight values of one-half, one-fourth and one-eighth, respectively will be generated at the positive analog output bus 2 and the negative analog output bus 4. The summer 6 sums the values on buses 2 and 4 as the output signal TW. T23 connected to negative bus 4 can selectively add minus one-eighth value to TW. As shown in Table I, with T23 at 4, the output TW goes from $-1$ to $+\frac{3}{4}$ of V(t) in one-fourth increments. With T23 at 2, the output TW goes from $-\frac{3}{4}$ to $+1$ in one-fourth increments. If buses 2 and 4 are connected together, the resulting signal goes from 0 to $+1$ in one-eighth increments. Flip-flops A, B, and C control the switching states of FETs T8, T9, T15, T16 and T20, T21, respectively. A serial tap weight word can be input to control line 6 to set the flip-flops, as for example in Table I.

TABLE I

| A | B | C | C' | TW |
|---|---|---|---|---|
| 0 | 0 | 0 | 0 | $-4/4$ |
| 0 | 0 | 1 | 0 | $-3/4$ |
| 0 | 1 | 0 | 0 | $-2/4$ |
| 0 | 1 | 1 | 0 | $-1/4$ |
| 1 | 0 | 0 | 0 | 0 |
| 1 | 0 | 1 | 0 | $+1/4$ |
| 1 | 1 | 0 | 0 | $+2/4$ |
| 1 | 1 | 1 | 0 | $+3/4$ |

The disclosed divert and divide circuit for tap weighting in a bucket brigade device offers a more accurate signal weighting technique than was available in the prior art for monolithic analog implementations.

FIG. 6 shows an alternate embodiment for the bucket brigade digital-to-analog converter invention. The input transistor $T_0$ may be used in either of two ways: (1) The serial digital word which represents the next value to be converted may be entered at the source of $T_0$, and the gate is clocked by 01. Converter accuracy is dependent on accurate digital input voltage levels. (2) The serial digital word may drive the gate of $T_0$ and accurate reference voltage $V_R$ may be connected to the source of $T_0$. Digital voltage accuracy is not required, but the digital word must change frequently to avoid long strings of all zeroes. In either case, the accurately sampled charge on the drain of $T_0$ is passed to N1 by normal bucket brigade action where it is divided into two very nearly equal halves, the first half being propagated through the transistor T2 and the second half being propagated through the transistor T8. Similarly, the remaining one-half portion of the input charge is propagated to T3, where, at node N2 the charge is divided in half with one-fourth of the input unit charge being propagated through transistor T4 and one-fourth being propagated through transistor T10. A similar operation obtains at the subsequent stages at nodes N3 through $N_{m+1}$ so that the transistor T9 would output a one-half unit of charge at its drain if a binary 1 is stored on the capacitor at node N1, the transistor T11 will output a one-fourth unit charge if a binary 1 is stored on the capacitor at node N2, and so on such that a resultant charge which is the sum of the charges output by the transistor T9, T11, T13, and etc. will appear at the output 0 as the analog value for the binary serial word input to the bucket brigade array.

For example, let the sources of $T_m$ and $T_n$ be connected directly to node $N_{m-1}$ such that the output of $T_{m+1}$ is one-sixteenth of the array input. If the binary word 1 0 1 0 is shifted into the array (least significant bit first) by either of the two ways described above, T9, T11, T13 and $T_{n+1}$ will weight the original input voltage by one-half, one-fourth, one-eighth, and one-sixteenth respectively, and the combined output at node $T_{n+1}$ will be the original input voltage multiplied by one-half (1) + one-fourth (0) + one-eighth (1) + one-sixteenth (1) equals eleven-sixteenths.

Source follower 14 acts as an isolating buffer between node $N_{n+1}$ and the output, and the output voltage at 0 is an approximate replica of the voltage at node $N_{n+1}$.

This results in an accurate digital-to-analog converter embodied in bucket brigade circuitry capable of compact packaging in a large scale integrated circuit device.

Although the preferred embodiment of the invention has been bucket brigade circuitry, the divert and divide principle of the subject invention can be implemented in other types of charge transfer devices, for example charge coupled devices (CCD).

While the invention has been particularly shown and described with respect to the preferred embodiment thereof, it will be understood by those skilled in the art that various changes in form and details may be made therein without departing from the spirit and scope of the invention.

We claim:

1. A binary-weighted signal attenuator, comprising:
    a first series array of charge transfer devices, having an input device connected to an input signal, and organized into sequentially connected stages of charge transfer devices with charge division output nodes at each stage, terminating with a first gated output device, for propagating one half the magnitude of said input signal;
    a second series array of charge transfer devices, having an input device connected to a first one of said output nodes of said sequentially connected stages of said first series array, and organized into sequentially connected stages of charge transfer devices with charge division output nodes at each stage, terminating with a second gated output device, for propagating one fourth the magnitude of said input signal;
    a third series array of charge transfer devices, having an input device connected to a first one of said output nodes of said sequentially connected stages of said second series array, and organized into sequentially connected stages of charge transfer devices with charge division output nodes at each stage, terminating with a third gated output device, for propagating one eighth the magnitude of said input signal;
    a signal summer having a first input connected to the outputs of said first, second and third gated output devices, for selectively summing as a first sum, one half, one fourth and one eighth magnitudes of said input signal in response to the selectively gated states of said first, second and third gated output devices, respectively;
    whereby selective binary weighted attenuation of said input signal is achieved.

2. The attenuation of claim 1, which further comprises:
    a fourth gated output device connected in parallel with said first gated output device;
    a fifth gated output device connected in parallel with said second gated output device;
    a sixth gated output device connected in parallel with said third gated output device;
    said signal summer having a second input connected to the outputs of said fourth, fifth and sixth gated output devices, for selectively summing as a second sum, one half, one fourth and one eighth magnitude of said input signal in response to the selectively gated states of said fourth, fifth and sixth gated output devices, respectively, said signal summer subtracting said second sum from said first sum;
    whereby selective positive or negative polarity binary attenuation of said input signal is achieved.

3. The attenuator of claim 2, which further comprises:
    a three stage binary storage means having a first stage with alternate control outputs connected to and alternately enabling said first and fourth gated output devices a second stage with alternate control putputs connected to and alternately enabling said second and fifth gated output devices, and a third stage with alternate control outputs connected to and alternately enabling said third and sixth gated output devices;
    whereby selective attenuation of said input signal can be achieved.

4. The attenuator of claim 3, wherein said binary storage means further comprises:
    a binary control word input which sets the respective states of said first, second and third stages of said storage means in response to a binary control word containing three control bits.

5. A digital-to-analog converter circuit, comprising:
    a binary signal input device for receiving the binary signal of $n$ bits to be converted;
    a series array of charge transfer devices, having an input connected to said binary signal input device, and organized into sequentially connected stages of charge transfer devices with charge division output nodes at each stage;
    a first branch series array of charge transfer devices, having an input connected to a first charge division output node of a first one of said sequentially connected stages, for propagating one half of the charge represented by said binary signal to a charge summing node;
    a second branch series array of charge transfer devices, having an input connected to a second charge division output node of a second one of said sequentially connected stages, for propagating one fourth, of the charge represented by said binary signal to said charge summing node;
    an $n$th branch series array of charge transfer devices, having an input connected to an $n$th charge division output node of an $n$th one of said sequentially connected stages, for propagating $2^{-n}$ of the charge represented by said binary signal to said charge summing node;
    whereby said circuit converts the numerical value of said n binary bits in said input signal into a corresponding charge magnitude at said summing node.

* * * * *